(12) United States Patent
Matsushita et al.

(10) Patent No.: US 6,249,943 B1
(45) Date of Patent: Jun. 26, 2001

(54) AUTOMATIC SEMICONDUCTOR WAFER APPLYING APPARATUS

(75) Inventors: Takao Matsushita; Shigeji Kuroda; Yoshinobu Ide, all of Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/198,489

(22) Filed: Nov. 24, 1998

(30) Foreign Application Priority Data

Dec. 8, 1997 (JP) .................................................. 9-336971

(51) Int. Cl.[7] ....................................................... B23P 23/06
(52) U.S. Cl. ...................... 29/33 M; 29/564.6; 29/564.7; 156/522; 280/79.2; 280/79.3; 280/655.1
(58) Field of Search .............................. 29/33 M, 564.6, 29/564.7, 729; 156/522, 559; 254/418, 423, 424, 425; 269/27; 280/47.17, 47.24, 47.26, 47.28, 47.29, 79.2, 79.3, 655.1

(56) References Cited

U.S. PATENT DOCUMENTS

| | | | | |
|---|---|---|---|---|
| 4,344,380 | * | 8/1982 | Matsumiya et al. | 118/66 |
| 4,350,560 | * | 9/1982 | Helgeland et al. | 156/617 SP |
| 4,481,067 | * | 11/1984 | Off et al. | 156/541 |
| 4,631,103 | * | 12/1986 | Ametani | 156/241 |
| 4,696,712 | * | 9/1987 | Nonaka | 156/351 |
| 4,775,438 | * | 10/1988 | Funakoshi et al. | 156/241 |
| 4,925,515 | * | 5/1990 | Yoshimura et al. | 156/250 |
| 5,098,244 | * | 3/1992 | Stimson | 414/7 |
| 5,123,636 | * | 6/1992 | Dumler et al. | 269/15 |
| 5,310,442 | * | 5/1994 | Ametani | 156/353 |
| 5,516,251 | * | 5/1996 | Ichikawa | 414/331 |
| 5,570,990 | * | 11/1996 | Bonora et al. | 414/543 |
| 5,645,392 | * | 7/1997 | Leichty et al. | 414/416 |
| 5,787,057 | * | 7/1998 | Fan | 369/34 |
| 5,795,432 | * | 8/1998 | Urban | 156/446 |
| 5,824,185 | * | 10/1998 | Nakamura et al. | 156/584 |
| 5,853,532 | * | 12/1998 | Nakamura et al. | 156/584 |
| 5,873,585 | * | 2/1999 | Engelking | 280/47.35 |
| 5,891,298 | * | 4/1999 | Kuroda et al. | 156/344 |
| 5,931,631 | * | 8/1999 | Bonora et al. | 414/416 |
| 5,933,942 | * | 8/1999 | Kitamura et al. | 29/740 |
| 5,983,479 | * | 11/1999 | Sato | 29/426.1 |
| 6,053,688 | * | 4/2000 | Cheng | 414/416 |

* cited by examiner

*Primary Examiner*—S. Thomas Hughes
*Assistant Examiner*—Essama Omgba
(74) *Attorney, Agent, or Firm*—Arent Fox Kintner Plotkin & Kahn

(57) ABSTRACT

Disclosed is an automatic semiconductor wafer applying apparatus capable of lightly easily stacking and loading ring frames onto a frame supply section. This apparatus has the following construction. An adhesive tape unwound from a tape roll is applied to a lower surface of the ring frame supplied to a tape applying position. The applied adhesive tape is cut out along the ring frame. The ring frame having the adhesive tape applied thereto is transported to a wafer applying position. A semiconductor wafer is applied onto the adhesive tape of the ring frame. In this apparatus, a frame supply truck movable with the ring frames stacked and held thereon is arranged so that it can be pushed/transported into and pulled out/transported from the frame supply section. A lift unit for receiving, lifting and supplying a group of ring frames stacked on the pushed and transported frame supply truck is installed in the frame supply section.

17 Claims, 16 Drawing Sheets

AUTOMATIC SEMICONDUCTOR WAFER APPLYING APPARATUS

BACKGROUND OF THE INVENTION

1. Field of the Invention

The present invention relates to an automatic semiconductor wafer applying apparatus for applying and holding a semiconductor wafer to a ring frame through an adhesive tape in a process prior to the process of scribing the semiconductor wafer.

2. Description of the Related Art

A conventional automatic semiconductor wafer applying apparatus is known to have a construction as described below. Ring frames, one by one, are taken out of a group of ring frames which are stacked and contained in a frame supply section, by a frame supply transport mechanism. The taken ring frame is transported and set to a predetermined tape applying position. An adhesive tape unwound from a tape roll is supplied to a lower surface of the ring frame and then applied thereto by a tape applying mechanism. The applied adhesive tape is cut out in a circular shape along the ring frame by a tape cutting mechanism. Then, the residual tape peeled from the lower surface of the ring frame is wound up and recovered. Also, the ring frame having the adhesive tape applied thereto is transported to a predetermined wafer applying position. A semiconductor wafer is transported and applied onto the adhesive tape of the ring frame which is positioned and set to the wafer applying position. Finally, the ring frame having the wafer applied thereto is stored in a frame storage section.

However, the prior art having such a construction has the following problem.

Recently, the ring frame having a large diameter has been used complying with the increase of the diameter of the semiconductor wafer. For a continuous operation, a large number of ring frames (for example, 200 to 300 ring frames) have been also loaded in the frame supply section. As a result, the total weight of the whole ring frame group is considerably heavy (under the assumption that one frame is 300 g, the total weight amounts to 60 kg through 90 kg). Thus, a great effort is required for the operation of stacking and loading the ring frames by inserting the hand into a lower portion of the apparatus.

SUMMARY OF THE INVENTION

The present invention has been made in view of the above facts. An object of the present invention is to provide an automatic semiconductor wafer applying apparatus capable of lightly efficiently stacking and loading ring frames onto a frame supply section.

In order to achieve the above object, the present invention is constituted in the following manner.

That is, the present invention provides an automatic semiconductor wafer applying apparatus for applying a semiconductor wafer to a ring frame through an adhesive tape, the apparatus comprising:

- a frame supply truck movable with ring frames stacked and held thereon;
- a frame supply section arranged so as to enable the frame supply truck to be pushed and transported thereinto and to be pulled out and transported therefrom;
- a lift unit for receiving, lifting and supplying a group of ring frames stacked on the frame supply truck pushed and transported into the frame supply section;
- a frame supply transport mechanism for supplying the ring frames lifted and supplied by the lift unit to a predetermined tape applying position;
- a tape applying mechanism for applying the adhesive tape unwound from a tape roll to a lower surface of the ring frame;
- a tape cutting mechanism for cutting out the applied adhesive tape along the ring frame;
- residual tape recovery means for winding up and recovering the residual tape peeled from the lower surface of the ring frame;
- transport means for transporting the ring frame having the adhesive tape applied thereto to a predetermined wafer applying position;
- wafer applying means for transporting and applying the semiconductor wafer onto the adhesive tape of the ring frame set to the wafer applying position; and
- a frame storage section for storing the ring frame having the semiconductor wafer applied thereto.

According to the apparatus of the present invention, a predetermined number of ring frames are moved while stacked on the frame supply truck. The ring frames are pushed and transported into the frame supply section together with the truck. The lift unit receives the group of ring frames from the pushed and transported frame supply truck. The frame supply transport mechanism takes out the ring frame from the group of ring frames and then supplies the ring frame to a predetermined tape applying position. The tape applying mechanism applies the adhesive tape to the ring frame supplied to the applying position. The tape cutting mechanism cuts out the adhesive tape applied to the ring frame along the ring frame. The residual tape recovery means winds up and recovers the residual tape peeled from the lower surface of the ring frame. The transport means transports the ring frame having the adhesive tape applied thereto to the wafer applying position. The wafer applying means applies the semiconductor wafer onto the adhesive tape of the ring frame transported to the wafer applying position. This ring frame having the semiconductor wafer applied thereto is stored in the frame storage section. The ring frames can be therefore supplied to the automatic semiconductor wafer applying apparatus only by pushing and transporting the frame supply truck having many ring frames stacked thereon into the frame supply section. Thus, the stacking and loading operation can be lightly easily performed, so that the operability can be improved.

Moreover, in the apparatus of the present invention, preferably, the frame supply truck comprises a frame guide member for preventing the group of stacked ring frames from collapsing, disposed so as to be openable and closeable. With such a constitution, when the ring frames are loaded onto the frame supply truck, the frame guide member is opened so that the loading operation is performed. On the other hand, when the frame supply truck is moved, the frame guide member is closed so as to prevent the moving ring frame group from collapsing. Accordingly, the frame supply truck can be easily moved without caring the collapsing of the group of stacked ring frames. This further facilitates the transport of the frames into the frame supply section.

Furthermore, preferably, the apparatus of the present invention further comprises truck guide means for vertically horizontally positioning the frame supply truck and for introducing the frame supply truck into the frame supply section. With such a constitution, when the frame supply truck is pushed and transported into the frame supply section, the truck guide means works so that the frame supply truck is transported and set to the frame supply section while it is correctly positioned relative to the lift unit in the frame supply section. Therefore, the operation of stacking and loading the ring frames into the frame supply section is simple and easy, while the frame supply accuracy can be improved. This is effective for the improvement of the accuracy in the subsequent applying process.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of the present invention will be described in detail below with reference to the accompanying drawings.

[First Embodiment]

Figure 18:
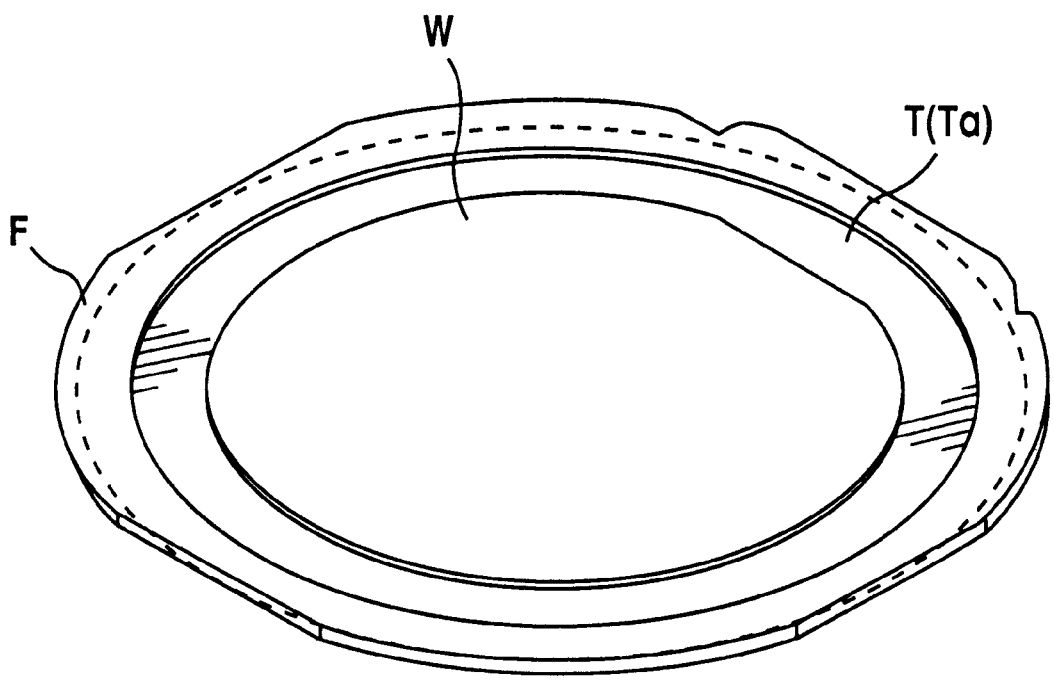
FIG. 18 is a perspective view of a ring frame having a semiconductor wafer applied and held thereto.

This automatic semiconductor wafer applying apparatus is used for applying and holding a semiconductor wafer W to a metal or plastic ring frame F through an adhesive tape T (Ta), as shown in FIG. 18. A first embodiment of the apparatus is shown in FIGS. 1 through 13.

Figure 1:
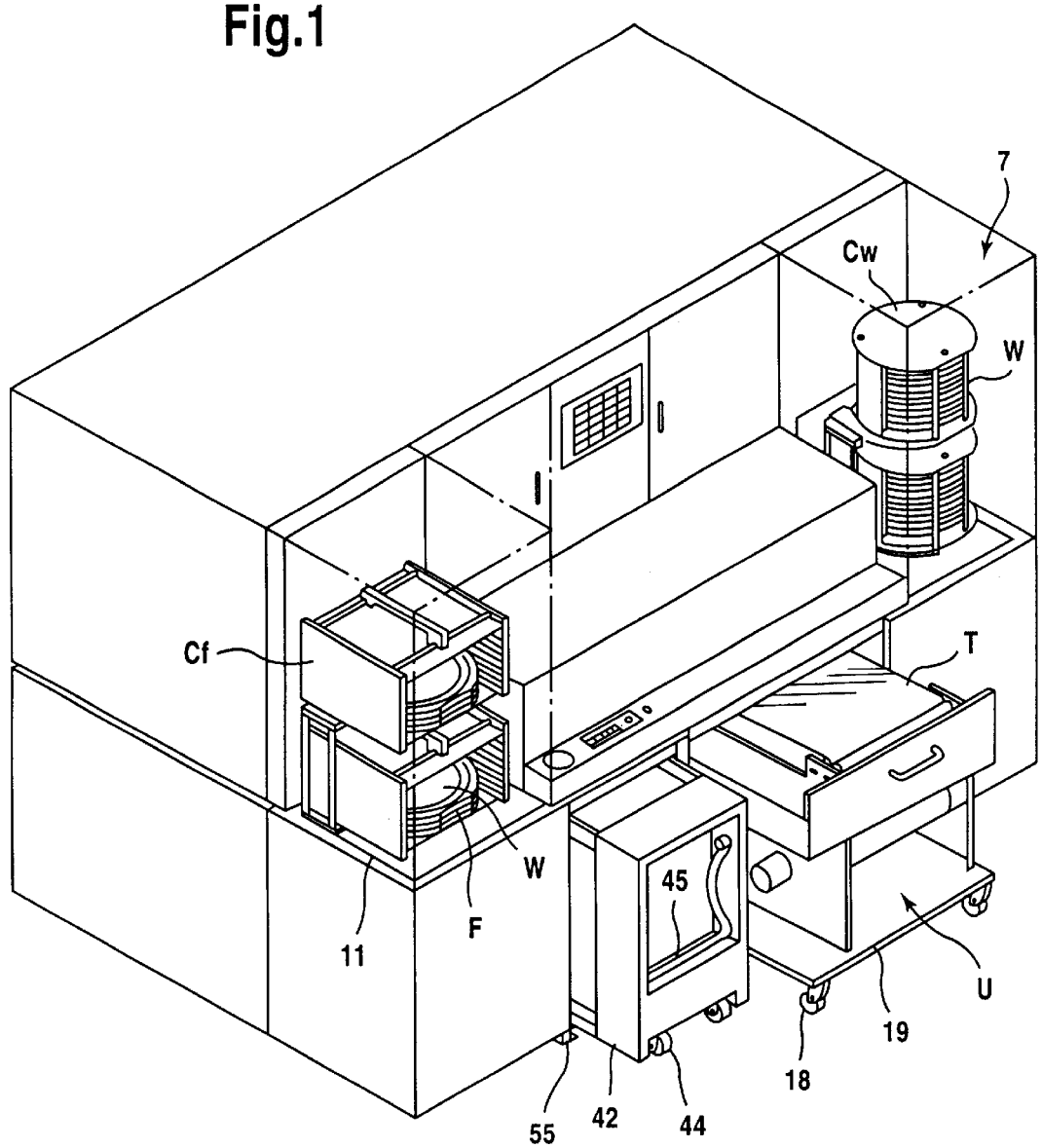
FIG. 1 is a general perspective view showing a first embodiment of the present invention.
Figure 2:
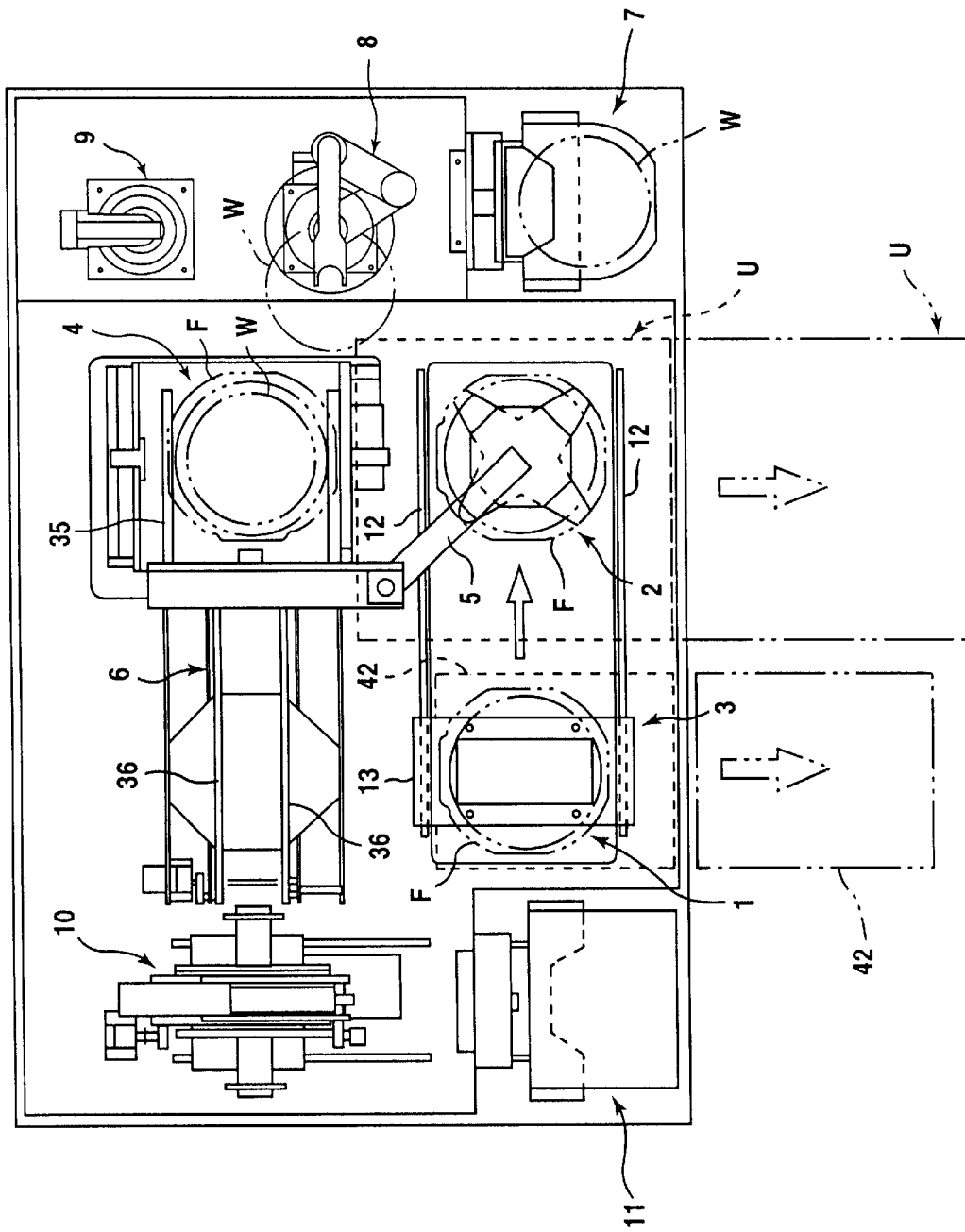
FIG. 2 is a general plan view of the first embodiment.
Figure 3:
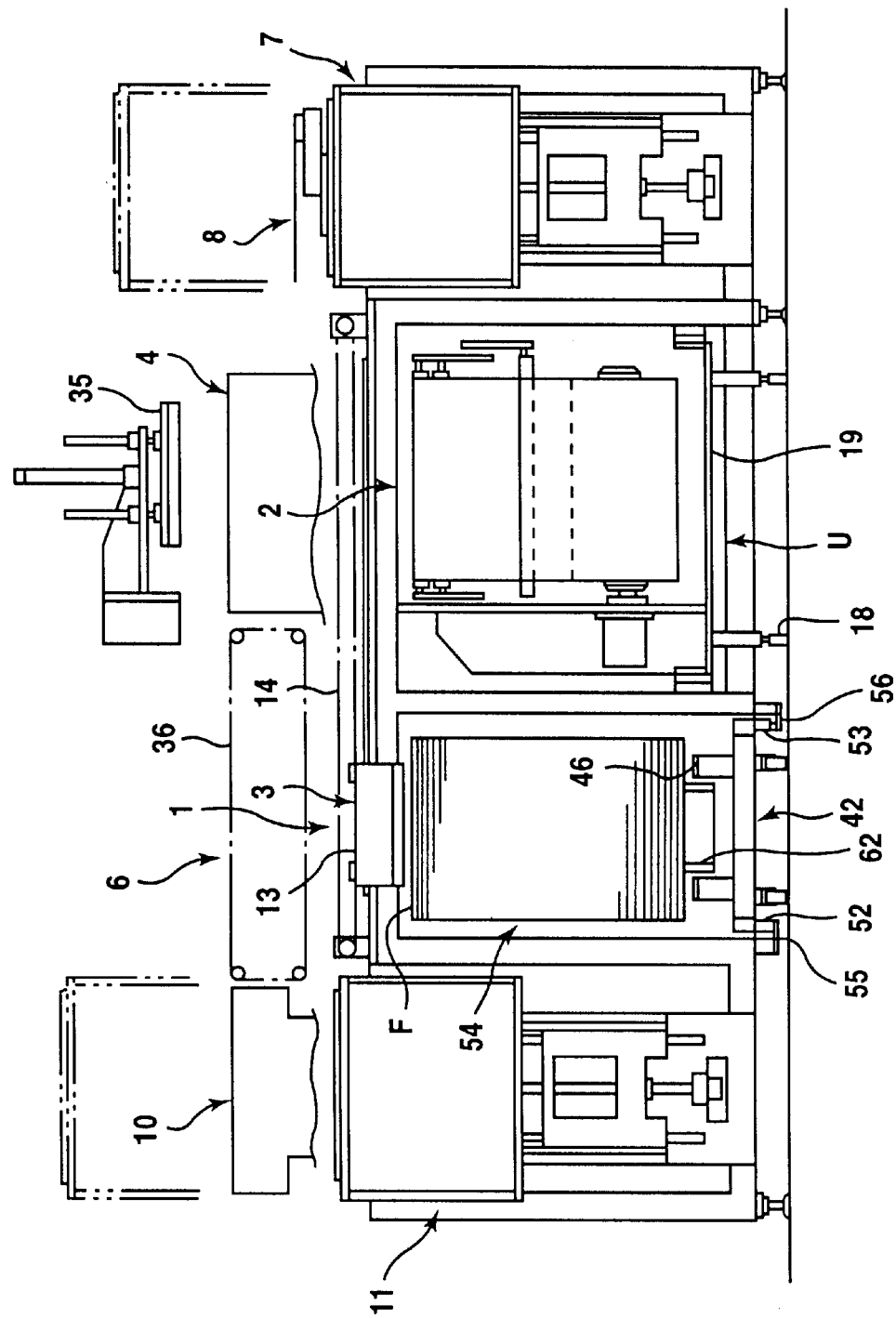
FIG. 3 is a front view of the first embodiment.

As shown in a general perspective view of FIG. 1, a general plan view of FIG. 2 and a front view of FIG. 3, a frame supply section 1 and an adhesive tape applying section 2 are arranged on the lower left and right on the front side of the apparatus body, respectively. A frame supply transport mechanism 3 is located over these sections 1 and 2. A wafer applying stage 4, a frame transport arm 5 and a frame transport mechanism 6 are arranged on the right and left sides behind this frame supply transport mechanism 3. A wafer supply section 7, a robot 8 for transporting the wafer and an aligner 9 for correcting a wafer posture are arranged from the front side to the back side on the right side of the apparatus. A labeling section 10 and a frame storage section 11 are arranged from the back side to the front side on the left side of the apparatus. The detailed constitutions of the sections will be described below.

Figure 4:
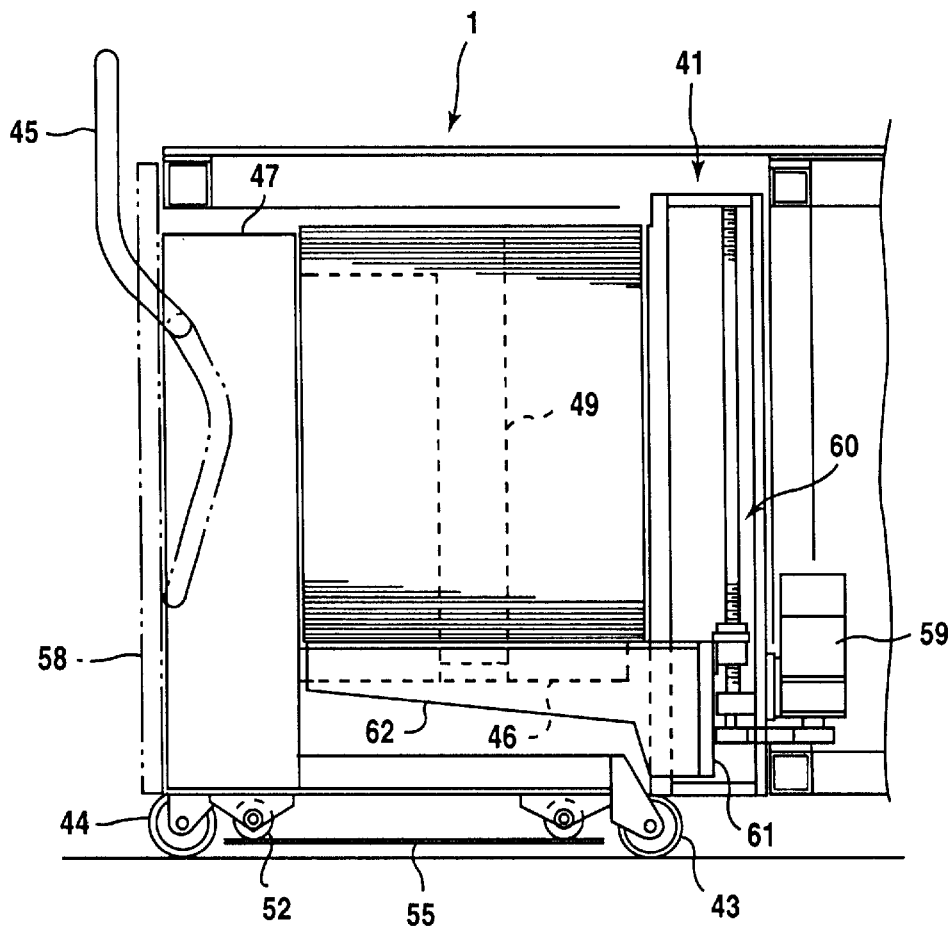
FIG. 4 is a vertical side view showing a frame supply truck and a lift unit in a frame supply section.
Figure 5:
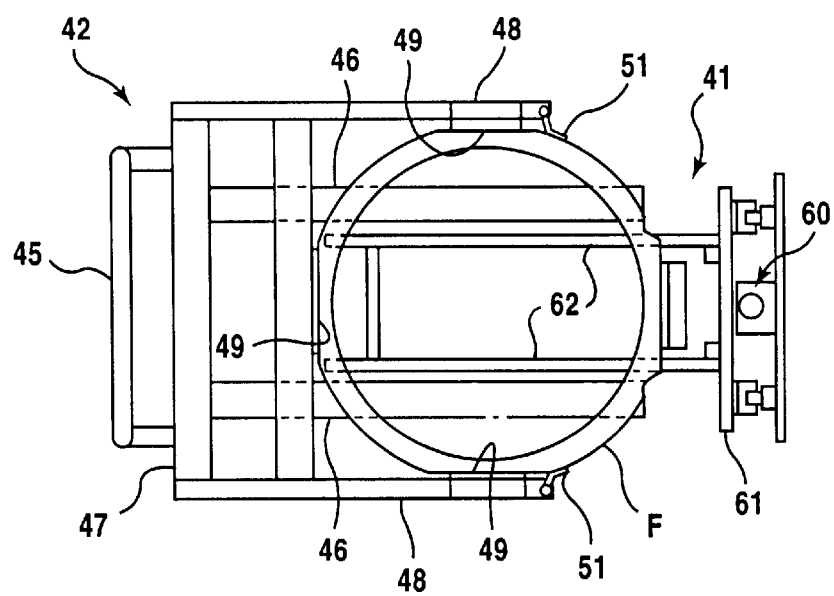
FIG. 5 is a plan view showing the frame supply truck and the lift unit.

As shown in FIGS. 4 and 5, the frame supply section 1 is constituted so that many ring frames F may be stacked and contained in a lift unit 41 and the ring frames F may be taken out sequentially from the uppermost one. A frame supply truck 42 constituted as described below is used for transporting and loading the ring frames F into this frame supply section 1.

The detailed constitution of this frame supply truck 42 is shown in FIGS. 4 through 9. A pair of left and right rotating wheels 43 are disposed in a front bottom portion of the frame supply truck 42. A pair of left and right caster wheels 44 are disposed in a rear bottom portion of the frame supply truck 42. The frame supply truck 42 is constituted so that it can be moved by pushing a handle 45 by hand. The handle 45 is mounted on a rear surface of the truck so that it may be pivotally withdrawable.

In the lower portion of the frame supply truck 42, a pair of left and right frame placing members 46 for stacking and placing the ring frames F thereon are disposed forward in a cantilever fashion. A pair of left and right side frameworks 48 extend forward from a rear framework 47 including the handle 45. The ring frames F are supported on the rear portion and the left and right sides by guide members 49 included in the rear framework 47 and the left and right side frameworks 48. The supported ring frames F are stacked and placed on the frame placing members 46.

Figure 7:
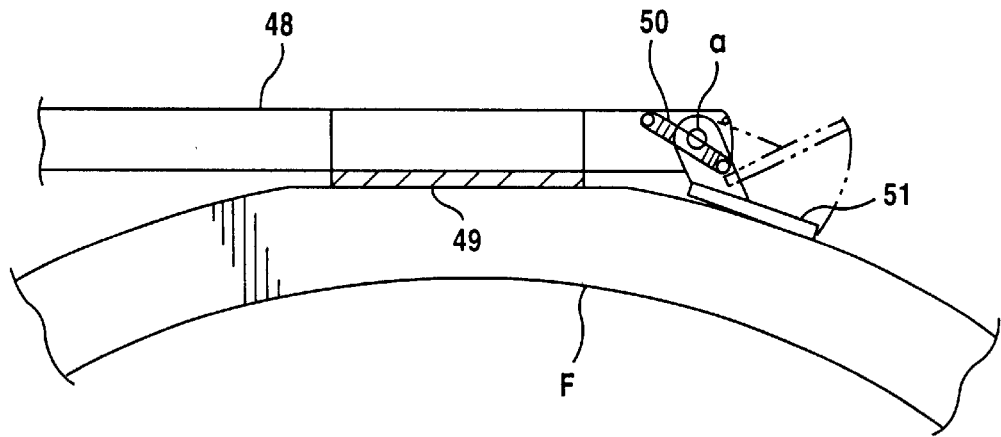
FIG. 7 is an enlarged plan view of means for preventing frames from collapsing.
Figure 8:
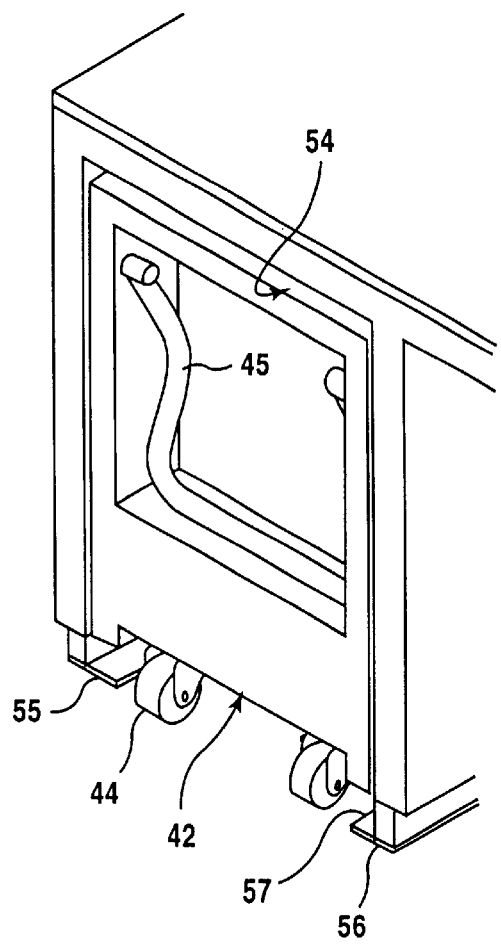
FIG. 8 is a perspective view of the situation where the frame supply truck is loaded in the frame supply section.
Figure 9:
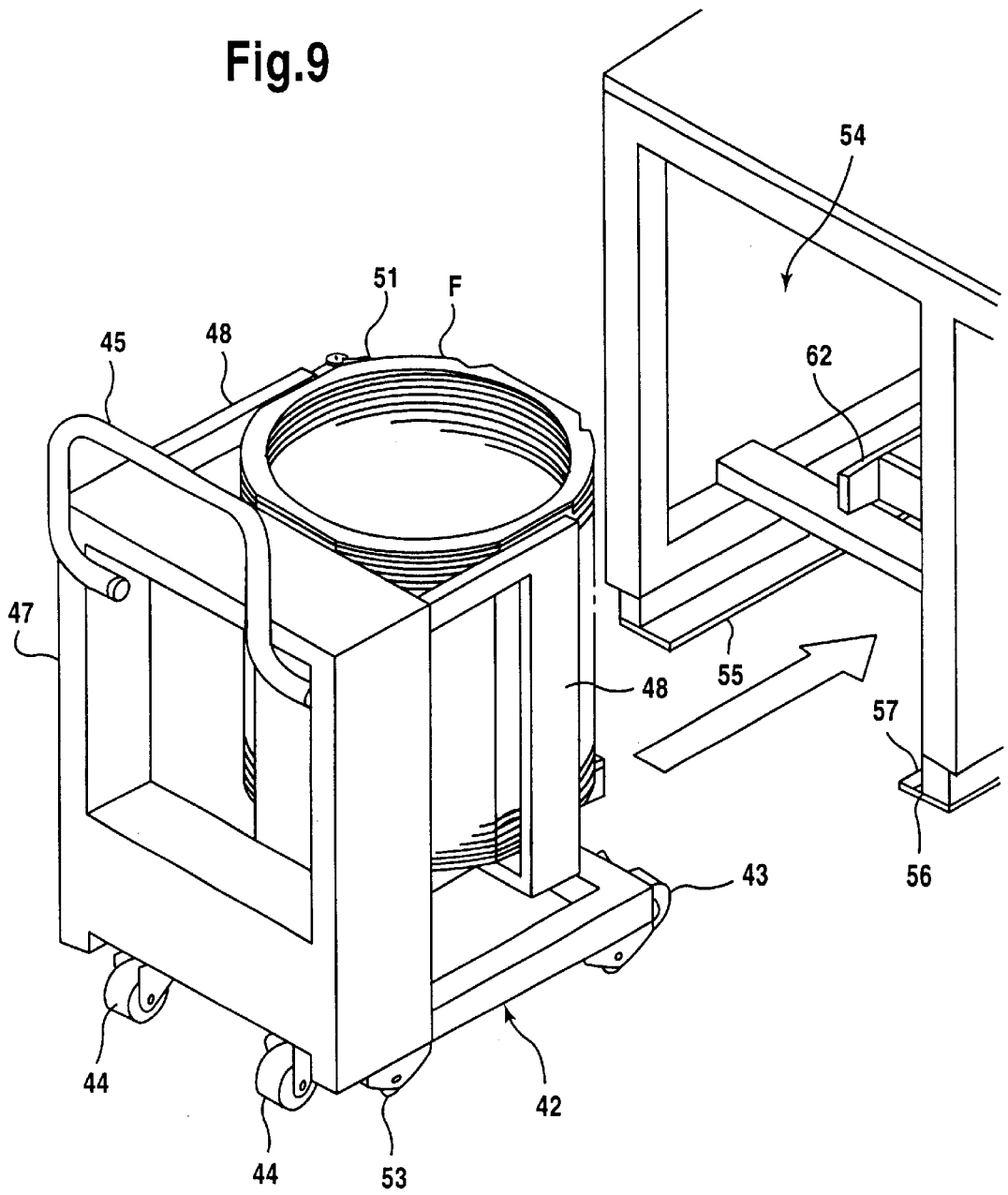
FIG. 9 is a perspective view of the situation where the frame supply truck is pulled out from the frame supply section.
Figure 10:
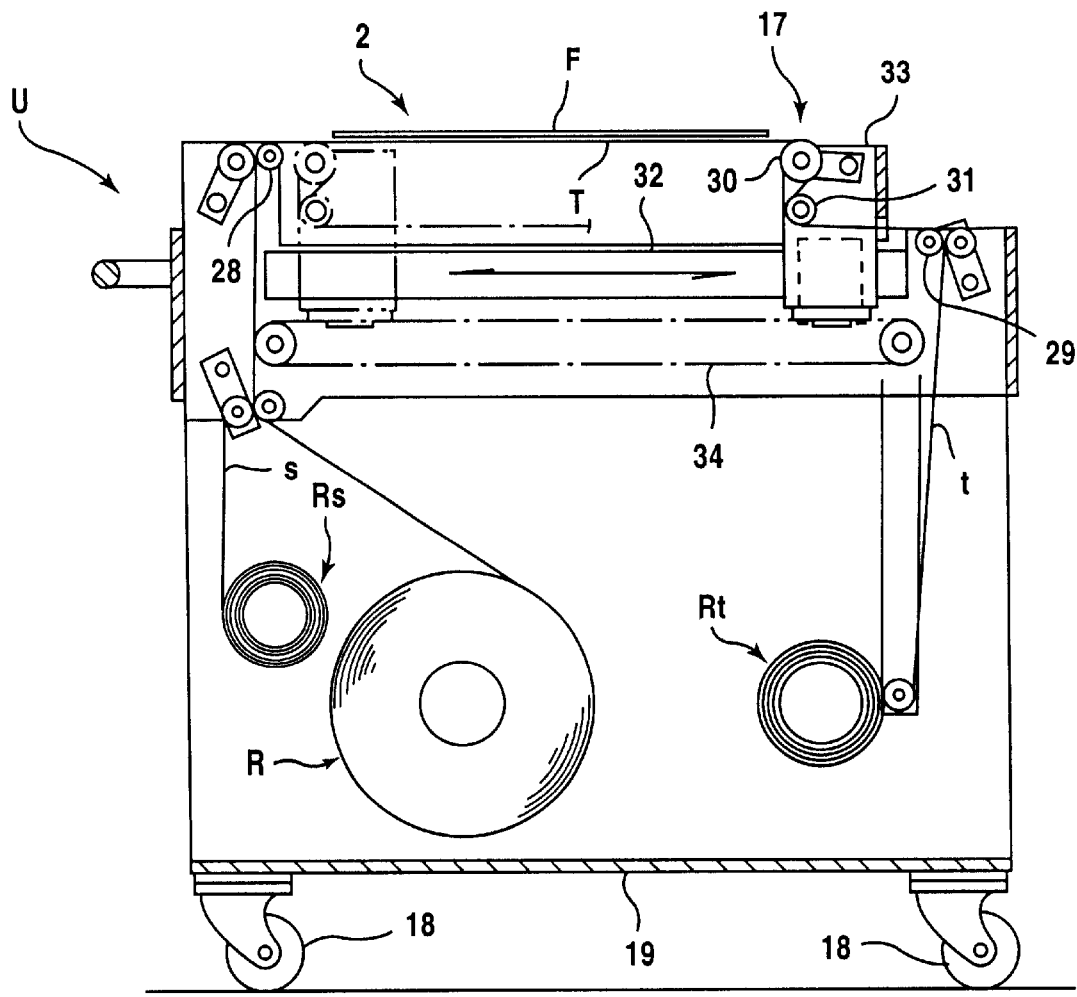
FIG. 10 is a vertical side view of a drawable unit in the first embodiment.
Figure 11:
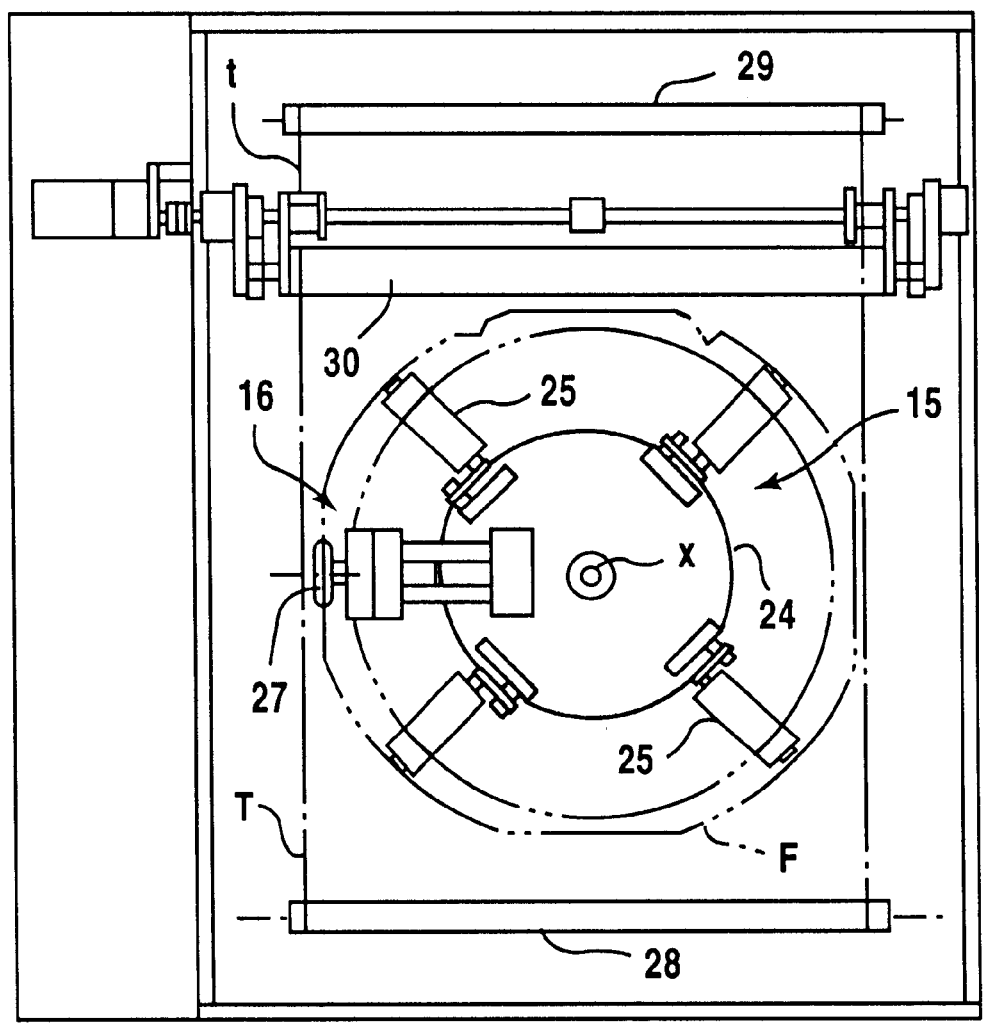
FIG. 11 is a plan view showing a tape applying mechanism and a tape cutting mechanism included in the drawable unit in the first embodiment.
Figure 12:
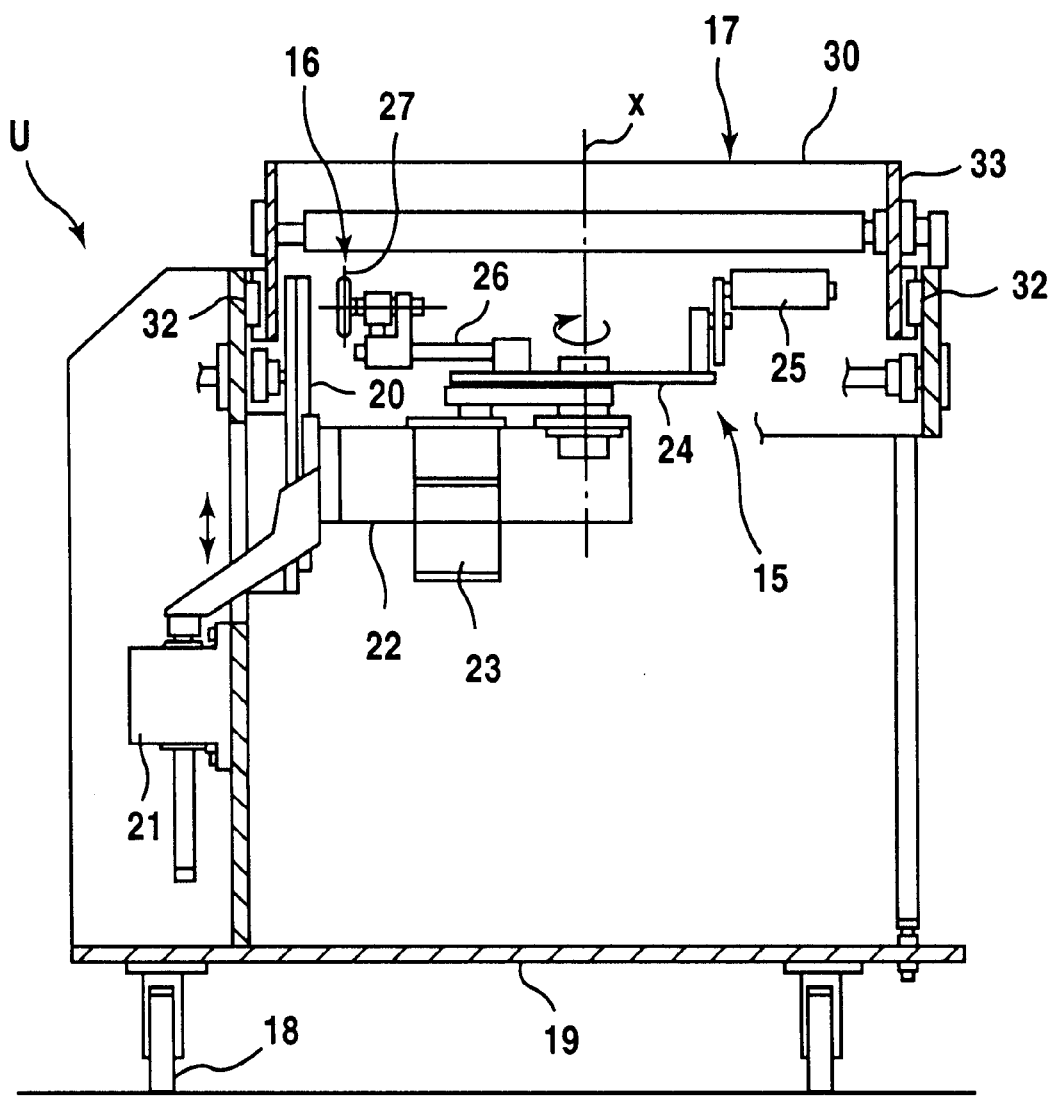
FIG. 12 is a vertical front view of the drawable unit in the first embodiment.

As shown in FIG. 7, a frame guide member 51 is disposed on the front end of each of the left and right side frameworks 48. The frame guide member 51 can be pivotally opened and closed about a fulcrum a. The frame guide member 51 is also loaded by a spring 50 so that it may be switched between its closed posture and its opened posture. For stacking and placing the cleaned ring frames F on the frame supply truck 42, the frame guide member 51 is opened so that a front portion of the truck is widely opened. When the stacking is terminated, the frame guide member 51 is closed. Thereby, the stacked and placed ring frames F are received and supported over their full height. This prevents a group of ring frames F from forward collapsing during moving the truck.

Figure 6:
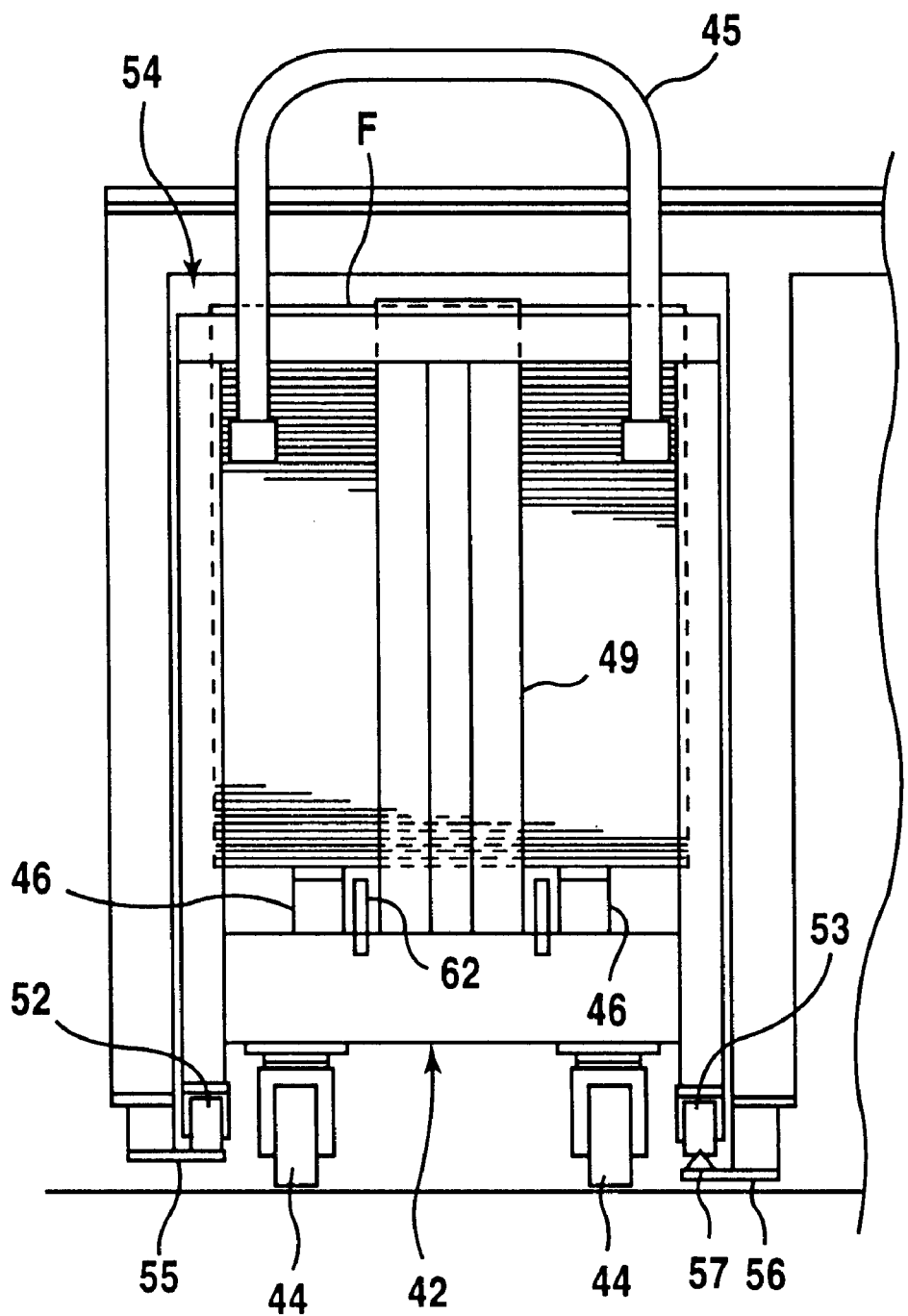
FIG. 6 is a rear view of the frame supply truck pushed and loaded in the frame supply section.

As shown in FIG. 6, a pair of front and rear guide rollers 52 and a pair of front and rear grooved guide rollers 53 are disposed on the left and right ends in the bottom portion of the frame supply truck 42. In the left and right lower portions of a truck containing chamber 54 in the frame supply section 1, disposed are guide members 55 and 56 on which the guide rollers 52 and the grooved guide rollers 53 travel. The right guide member 56 includes an angled guide rail 57 for horizontally positioning and guiding the grooved guide rollers 53. When the frame supply truck 42 is pushed and moved into the truck containing chamber or bay 54 from the front end thereof, the guide rollers 52 and the grooved guide rollers 53 run onto and move on the guide members 55 and 56. Thereby, the frame supply truck 42 is transported into the frame supply section 1 while it is horizontally and vertically positioned.

The rotating wheels 43 and the caster wheels 44 are located so that they may float over a floor surface when the frame supply truck 42 is transported into the frame supply section 1. As shown in FIG. 4, the frame supply truck 42 transported into the frame supply section 1 is contained by folding the handle 45 without extruding from a front surface of the apparatus. Thus, a front door 58 can remain closed.

As shown in FIGS. 4 and 5, the lift unit 41 is constituted in the following manner. That is, a frame support arm 62 extends from a movable framework 61 toward the front surface of the apparatus in the cantilever fashion. The movable framework 61 is raised and lowered by a screw mechanism 60 driven by a motor 59. The frame support arm 62 is lowered to a lower limit while the frame supply truck 42 is transported into the frame supply section 1. Thereby, the frame support arm 62 enters under the frame placing members 46. In this state, the frame support arm 62 is raised, whereby the group of stacked ring frames F can be lifted and supplied.

As shown in FIGS. 2 and 3, the frame supply transport mechanism 3 is constituted as described below. A movable table 13 is movable horizontally leftward and rightward along a pair of front and rear guide rails 12. The movable table 13 is coupled to a rotated belt 14 so that it may be moved leftward and rightward. On the left end of the moving stroke of the movable table 13, the uppermost ring frame F in the frame supply section 1 is taken out by vacuum suction. The ring frame F is transported to the right end of the moving stroke. The ring frame F is supplied over the adhesive tape applying section 2.

As shown in FIGS. 10 through 13, in the upper portion of the adhesive tape applying section 2, arranged are a tape applying mechanism 15 for applying the adhesive tape T to a lower surface of the ring frame F held and transported by the movable table 13; a tape cutting mechanism 16 for cutting out the applied adhesive tape T along the ring frame; and a tape peeling mechanism 17 for peeling a residual tape t from the lower surface of the ring frame F. In the lower portion of the adhesive tape applying section 2, arranged are a tape roll R which the adhesive tape T with a separator is wound around; a separator recovery roll Rs for winding up and recovering a peeled separator s; a residual tape recovery roll Rt for winding up and recovering the residual tape t; and the like.

The above-described elements constituting the adhesive tape applying section 2 are installed on a truck 19 including wheels 18 in the lower portion thereof. The whole adhesive tape applying section 2 is constituted as a drawable unit U which can be pulled out and pushed in from the front surface of the apparatus together with the truck 19.

The tape applying mechanism 15 comprises a movable framework 22 which is supported so that it can be raised and lowered along a guide rail 20 and which is raised and lowered by a cylinder 21; a rotating disc 24 which is disposed in the movable framework 22 so that it can be rotated about a longitudinal axis x by a motor 23; a plurality of freely rotatable forcing rollers 25 radially disposed in this rotating disc 24; or the like. The adhesive tape T is forced by the forcing rollers 25 from a lower position along the lower surface of the ring frame F held by the movable table 13 of the frame supply transport mechanism 3 and positioned to a predetermined position, while it is rotated about the longitudinal axis x. Thereby, the adhesive tape T is applied to the whole lower surface of the ring frame F.

The tape cutting mechanism 16 comprises a disc cutter 27. The disc cutter 27 is disposed on the distal end of a support arm 26 mounted to the rotating disc 24 in such a manner that it can be freely rotated about a horizontal axis. The disc cutter 27 is brought into contact with the lower surface of the ring frame, while the rotating disc 24 is rotated. Thereby, the adhesive tape T applied to the lower surface of the ring frame F is cut out in a circular shape along the ring frame F.

The tape peeling mechanism 17 comprises front and rear fixed rollers 28, 29 for winding and guiding the adhesive tape T; and a pair of movable rollers 30, 31 for winding and guiding the adhesive tape T between the rollers 28, 29 and moving forward and backward. The movable rollers 30, 31 are supported by a movable framework 33 which can be moved forward and backward along left and right guide rails 32. The movable framework 33 reciprocates forward and backward by the rotation of a belt 34. This operation is schematically shown in FIG. 13.

Figure 13A:
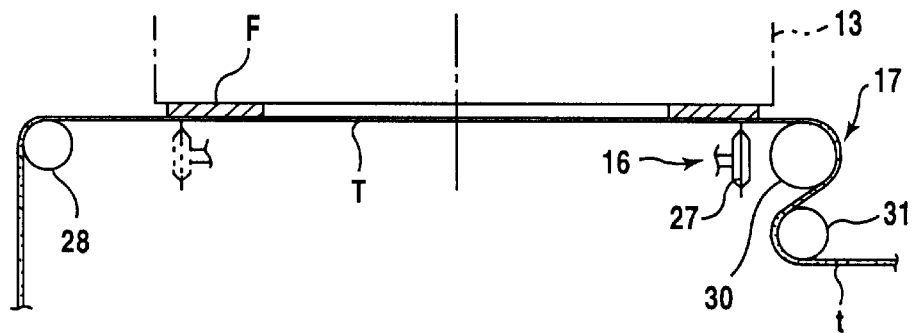
FIGS. 13A, 13B and 13C are illustrations for describing a process of peeling a residual tape in the first embodiment.
Figure 13B:
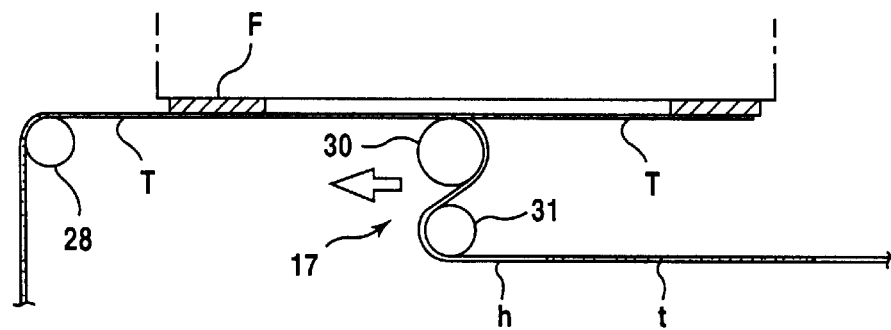
Figure 13C:
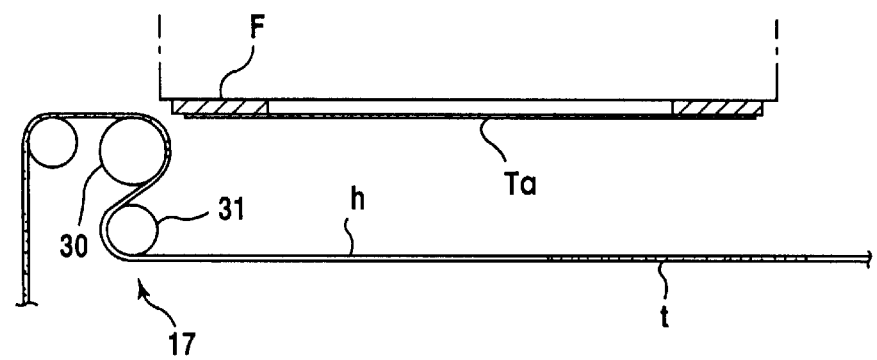
Figure 14:
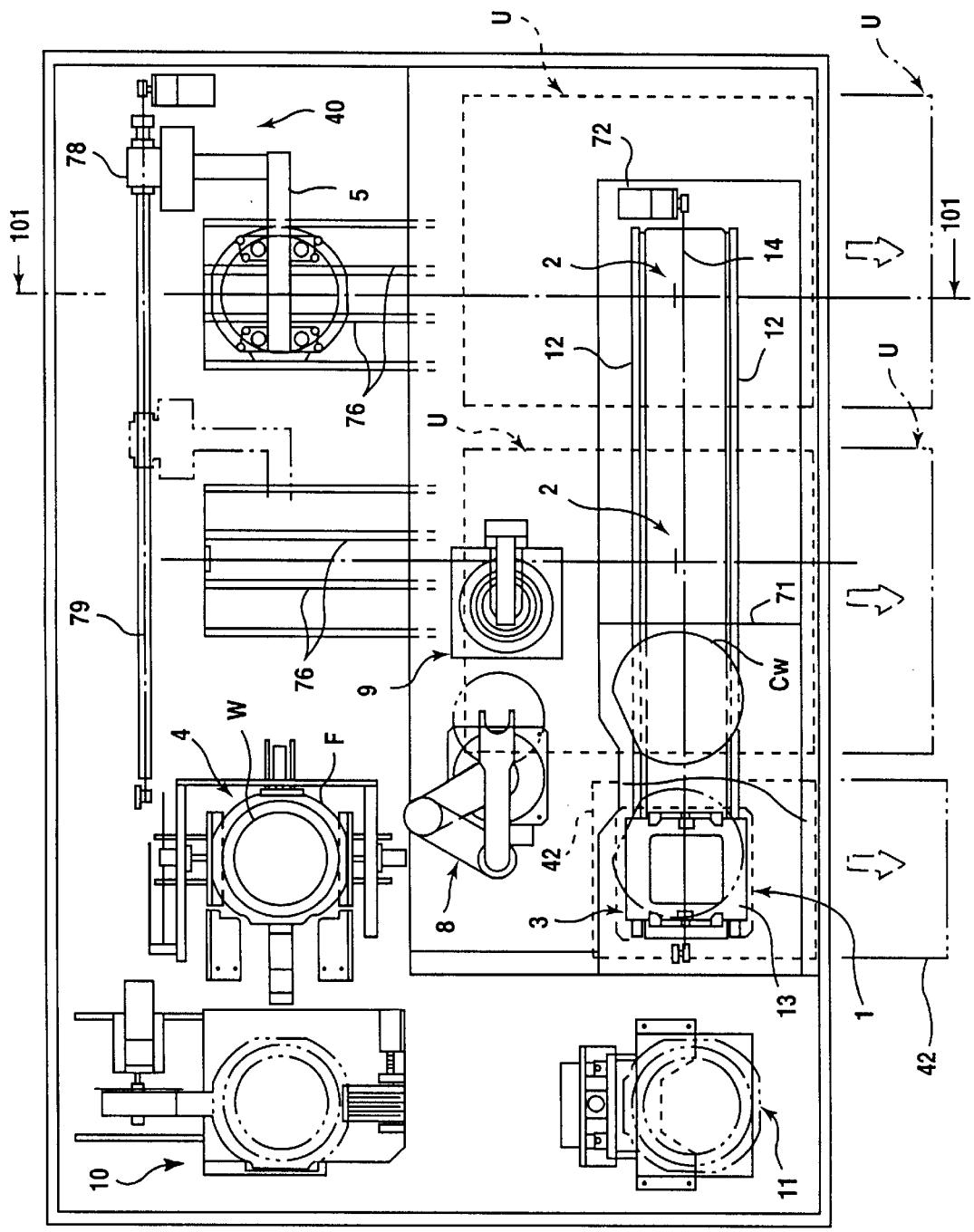
FIG. 14 is a general plan view showing a second embodiment of the present invention.
Figure 15:
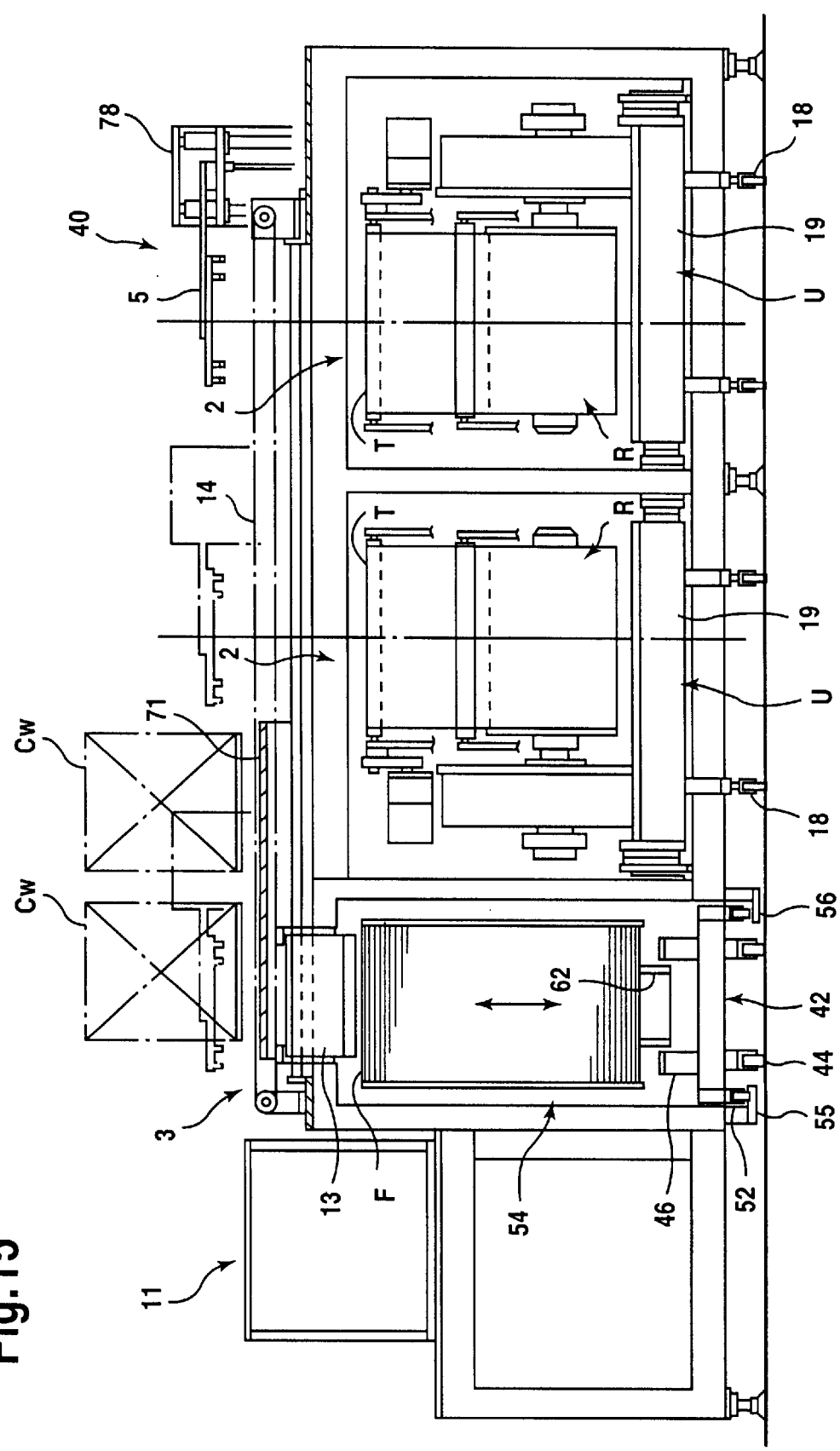
FIG. 15 is a front view of the second embodiment.
Figure 16:
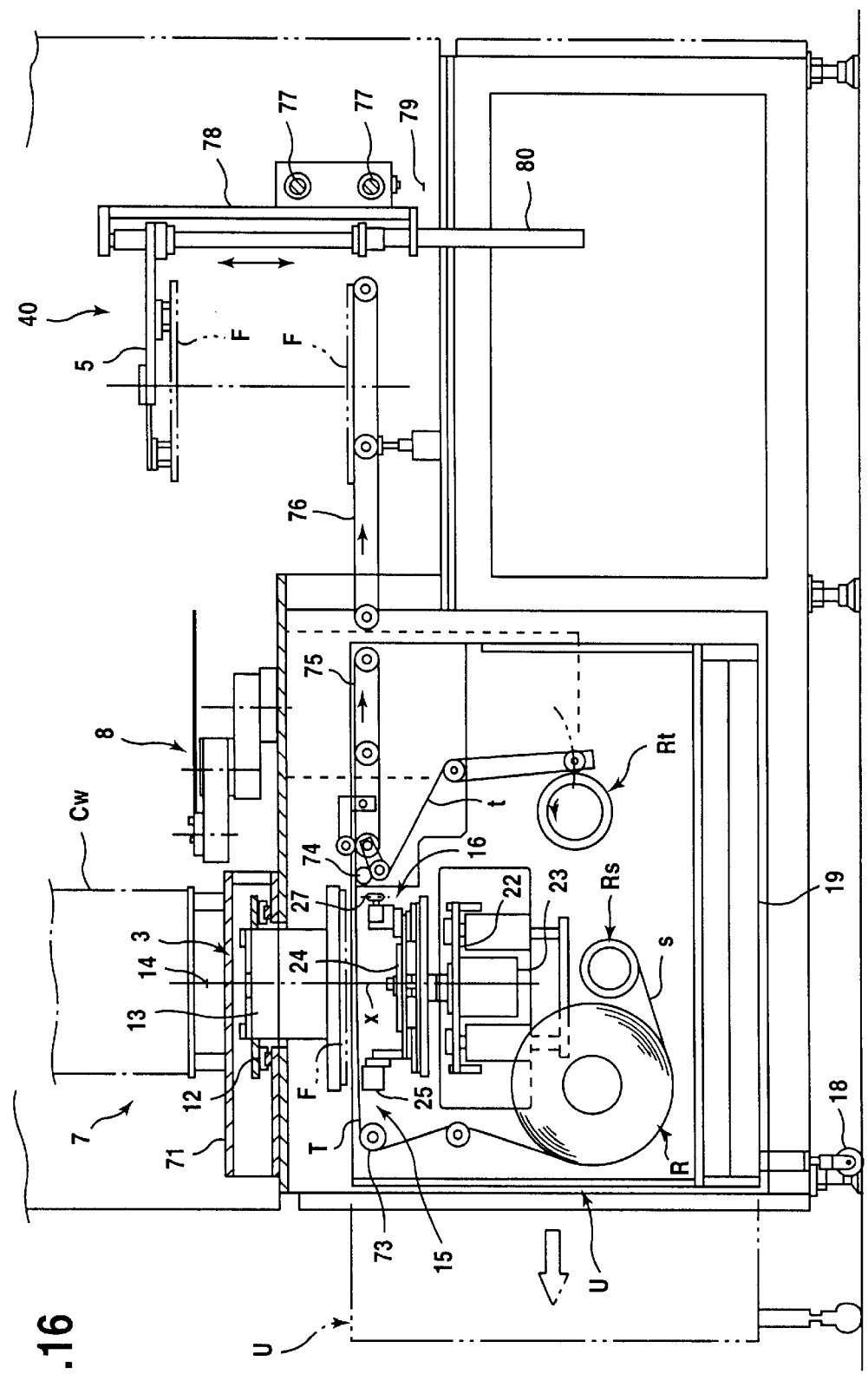
FIG. 16 is a cross sectional view taken on line 101—101 of FIG. 14.

That is, as shown in FIG. 13A, in the process of applying the tape and the process of cutting the tape, a pair of movable rollers 30, 31 are located at an original position in the rear portion. When the adhesive tape T applied to the whole lower surface of the ring frame F is cut out in the circular shape by the tape cutting mechanism 16, the movable rollers 30, 31 are moved forward as shown in FIG. 13B. Then, the circular adhesive tape Ta applied to the lower surface of the ring frame F is left, while the peripheral residual tape t is peeled from the lower surface of the ring frame F. Finally, as shown in FIG. 13C, the residual tape t having a circular cut hole h bored therethrough is peeled from the whole lower surface of the ring frame F. After that, the residual tape t is wound up and recovered by the tape recovery roll Rt. The movable rollers 30, 31 return to the rear portion, whereby the adhesive tape T having no hole is pulled out downwardly of a frame supply position for the subsequent application.

In this manner, the ring frame F, whose lower surface has the circularly cut adhesive tape Ta applied thereto, is supported and supplied to the wafer applying stage 4 by the oscillating frame transport arm 5.

As shown in FIGS. 1 and 2, two upper and lower wafer cassettes Cw containing many semiconductor wafers W inserted therein are loaded in the wafer supply section 7. The wafer supply section 7 loading the wafer cassettes Cw therein is raised and lowered. The multi-joint robot 8 for transporting the wafer takes out the semiconductor wafers W, one by one, from the wafer cassette Cw. The robot 8 supplies the semiconductor wafer W to the aligner 9. In the aligner 9, the orientation of an orientation flat of the semiconductor wafer W is corrected and aligned. The semiconductor wafer W whose posture is corrected is supplied again to the wafer applying stage 4 by the wafer transporting robot 8. The semiconductor wafer W is held by a wafer suction hand 35 included in this stage 4, instead of the robot 8. Then, the semiconductor wafer W is placed on the center of the positioned loaded ring frame F. The semiconductor wafer W is applied to an upper surface of the adhesive tape Ta.

The ring frame F, which the semiconductor wafer W has been applied to, is placed on a transport belt 36 of the frame transport mechanism 6. The ring frame F is transported from the wafer applying stage 4 and transported into the labeling section 10. In this section 10, a label having an identification bar code determined for each wafer is attached to an appropriate portion of the ring frame F. Then, the ring frame F is fed to the frame recovery storage 11. In this section 11, the ring frames F are successively inserted and contained into two upper and lower stacked waiting frame cassettes Cf.

As described above, the whole adhesive tape applying section 2 is constituted as the drawable unit U which can be pulled out and pushed in from the front surface of the apparatus together with the truck 19. Thus, when the tape roll R is consumed, the drawable unit U is pulled out greatly forwardly of the apparatus so as to provide a wide working space around the apparatus. In this wide space, the old tape roll R is replaced by the new tape roll R, the residual tape recovery roll Rt and the separator recovery roll Rs are detached, and the new adhesive tape T is wound and set, etc. The maintenance of the tape applying mechanism 15, the tape cutting mechanism 16, the tape peeling mechanism 17 or the like is also performed by pulling out the drawable unit U greatly forwardly of the apparatus.

[Second Embodiment]

FIGS. 14 through 17 show a second embodiment of the automatic semiconductor wafer applying apparatus according to the present invention.

In this embodiment, the frame supply section 1 and two sets of left and right adhesive tape applying sections 2 are arranged on the lower left and right on the front side of the apparatus body, respectively. The frame supply transport mechanism 3 is located over these sections 1 and 2. The wafer applying stage 4 is arranged on the left side behind this frame supply transport mechanism 3. A frame transport mechanism 40 for transporting the tape-applied ring frame F to the wafer applying stage 4 is arranged on the right side. The wafer transporting robot 8 and the aligner 9 are arranged between the frame supply transport mechanism 3 and the wafer applying stage 4. A frame table 71 is arranged so that it may cross over the left half of the frame supply transport mechanism 3. The two left and right wafer cassettes Cw can be mounted on the frame table 71. The labeling section 10 and the frame storage section 11 are arranged from the back side to the front side on the left end of the apparatus body.

The ring frames F are transported and set to the frame supply section 1 by the frame supply truck 42 constituted in the same manner as the first embodiment. The ring frames F are delivered to a lift unit 41 (not shown). The frame supply transport mechanism 3 is constituted as described below. The movable table 13 is movable horizontally leftward and rightward along a pair of front and rear guide rails 12. The movable table 13 is coupled to the belt 14 driven and rotated by the motor 72 so that it may be moved leftward and rightward. On the lower left end of the moving stroke of the movable table 13, the uppermost ring frame F in the frame supply section 1 is taken out. The ring frame F is supplied over one of two sets of adhesive tape applying sections 2.

Each of two sets of adhesive tape applying sections 2 comprises the tape applying mechanism 15; the tape cutting mechanism 16; the tape roll R; front and rear guide rollers 73, 74 for winding and supplying the adhesive tape T upwardly of the tape applying mechanism 15; a frame transport belt 75 positioned behind the guide rollers 73, 74; the tape recovery roll Rt for recovering the residual tape t; the separator recovery roll Rs; and the like. These elements are installed on the truck 19 including the wheels 18. The whole adhesive tape applying section 2 is constituted as the drawable unit U in the same manner as the first embodiment.

The tape applying mechanism 15 comprises the movable framework 22 raised and lowered; the rotating disc 24 which is disposed in the movable framework 22 so that it can be rotated about the longitudinal axis x by the motor 23; a plurality of freely rotatable forcing rollers 25 radially disposed in this rotating disc 24; or the like. In the same way as the first embodiment, the adhesive tape T wound and passing over the front and rear guide rollers 73, 74 is forced by the forcing rollers 25 from the lower position along the lower surface of the ring frame F, while it is rotated about the longitudinal axis x. Thereby, the adhesive tape T is applied to the whole lower surface of the ring frame F.

The tape cutting mechanism 16 comprises the disc cutter 27. The disc cutter 27 is mounted to the rotating disc 24 in such a manner that it can be freely rotated about the horizontal axis. Similarly to the first embodiment, the disc cutter 27 is brought into contact with the lower surface of the ring frame, while the rotating disc 24 is rotated. Thereby, the adhesive tape T applied to the lower surface of the ring frame F is cut out in the circular shape along the frame F.

Figure 17A:
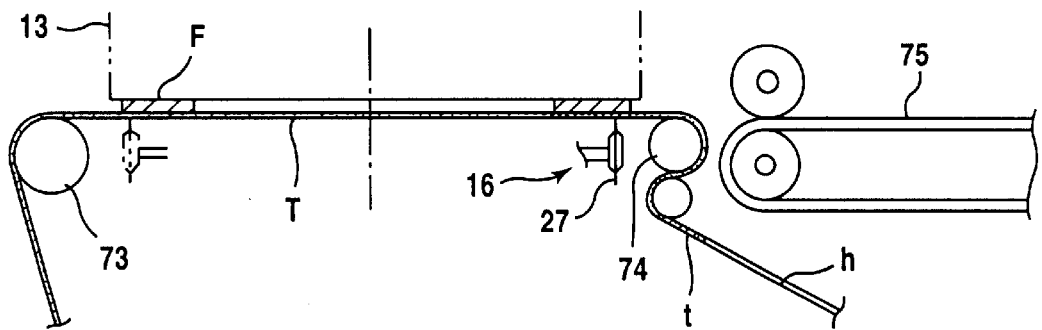
FIGS. 17A, 17B and 17C are illustrations for describing the process of peeling the residual tape in the second embodiment.
Figure 17B:
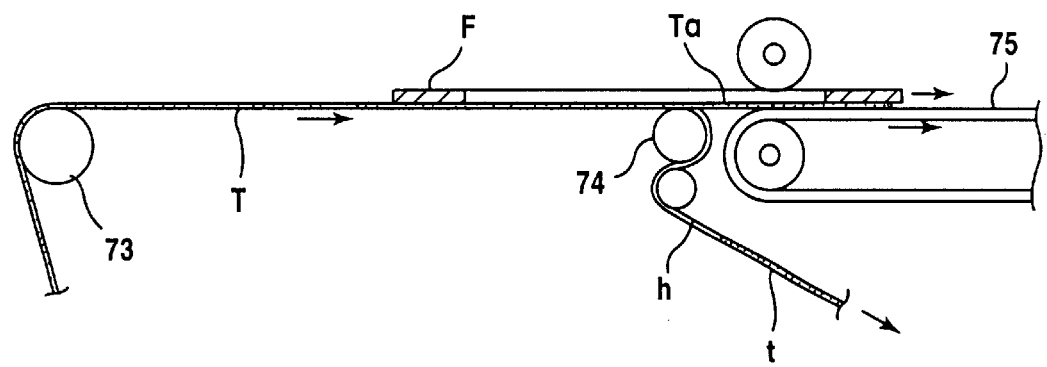
Figure 17C:
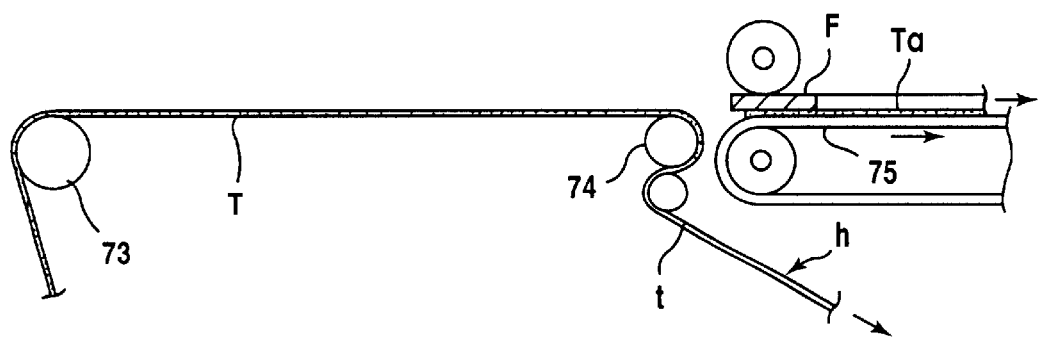

This embodiment includes no exclusive mechanism for peeling the residual tape t. The residual tape t applied to the lower surface of the ring frame F is peeled in the following manner. That is, as shown in FIG. 17A, in the process of applying the tape and the process of cutting the tape, the ring frame F is held by the movable table 13. However, when the adhesive tape T applied to the whole lower surface of the ring frame F is cut out in the circular shape by the tape cutting mechanism 16, the holding of the frame by the movable table 13 is released as shown in FIG. 17B. The residual tape t is also wound up. Then, the circular adhesive tape Ta applied to the lower surface of the ring frame F is left, while the peripheral residual tape t is peeled from the lower surface of the ring frame F. With the movement of the tape, the ring frame F is fed inwardly of the apparatus and received by the frame transport belt 75. Finally, as shown in FIG. 17C, the residual tape t having the circular cut hole h bored therethrough is peeled from the whole lower surface of the ring frame F. The ring frame F having the adhesive tape Ta applied thereto is transported further inwardly of the apparatus by the frame transport belt 75. Thereby, the adhesive tape T having no hole is pulled out downwardly of the frame supply position for the subsequent application.

The apparatus body behind each drawable unit U includes a frame supply belt 76 for receiving and further inwardly transporting the tape-applied ring frame F fed by the frame transport belt 75 of each drawable unit U.

The frame transport mechanism 40 comprises a movable framework 78 which is supported so that it can be moved leftward and rightward along a pair of upper and lower guide rails 77 and which is driven leftward and rightward by a rotated belt 79; and the frame transport arm 5 which is supported so that it can be raised and lowered through a cylinder 80. The ring frame F is placed and transported on/by the frame transport belt 75 and the frame supply belt 76 from each adhesive tape applying section 2. The ring frame F is sucked/held and transported into the wafer applying stage 4 by the frame transport arm 5.

On the wafer applying stage 4, the semiconductor wafer W supplied by the wafer transporting robot 8 is applied to the adhesive tape Ta of the transported positioned ring frame F. The ring frame F is further transported to the labeling section 10. In this section 10, the label with the bar code is attached to the ring frame F. Then, the ring frame F is fed to the frame storage section 11.

In the above embodiments, the drawable unit U comprises the mechanisms and replaceable members constituting the adhesive tape applying section 2, all of which are installed on the truck 19. Preferably, mechanical devices such as the tape applying mechanism 15, the tape cutting mechanism 16 and the tape peeling mechanism 17 remain in the apparatus body. On the other hand, the members alone requiring the replacement, such as the tape roll R, the tape recovery roll Rt for recovering the residual tape t and the separator recovery roll Rs are installed on the truck 19, whereby the drawable unit U is constituted and embodied.

The present invention may be embodied in other specific forms without departing from the spirit or essential attributes thereof and, accordingly, reference should be made to the appended claims, rather than to the foregoing specification, as indicating the scope of the invention.

What is claimed is:

1. An automatic semiconductor wafer applying apparatus for applying a semiconductor wafer to a ring frame through an adhesive tape, said apparatus comprising:
   a frame supply truck movable with ring frames stacked and held thereon;
   a frame supply section having a bay sized and adapted to enable said frame supply truck to be pushed and transported into the bay and to be pulled out and transported from the bay;
   a lift unit disposed at least partially in the bay of said frame supply section for receiving, lifting and supplying a group of ring frames stacked on said frame supply truck pushed and transported into the bay of said frame supply section;
   a frame supply transport mechanism for supplying the ring frames lifted and supplied by said lift unit to a predetermined tape applying position;
   a tape applying mechanism for applying the adhesive tape unwound from a tape roll to a lower surface of the ring frame;
   a tape cutting mechanism for cutting out the applied adhesive tape along the ring frame;
   residual tape recovery means for winding up and recovering residual tape peeled from the lower surface of the ring frame;
   transport means for transporting the ring frame having the adhesive tape applied thereto to a predetermined wafer applying position;
   wafer applying means for transporting and applying the semiconductor wafer onto the adhesive tape of the ring frame set to said wafer applying position; and
   a frame storage section for storing the ring frame having the semiconductor wafer applied thereto.

2. The apparatus according to claim 1, wherein said frame supply truck comprises:
   frame placing members for stacking and placing the group of ring frames thereon, disposed in a cantilever fashion;
   a pair of left and right side frameworks disposed so as to support, from left and right side portions, the group of ring frames stacked and placed on said frame placing members;
   a rear framework disposed so as to support, from a rear side portion, the group of ring frames stacked and placed on said frame placing members; and
   a plurality of wheels enabling an integral movement of said frame placing members, said side frameworks and said rear framework.

3. The apparatus according to claim 2, wherein said frame supply truck further comprises:
   a frame guide member disposed on a front end of said side framework so as to be openable and closeable for preventing the group of ring frames stacked and placed on said frame placing members from forwardly collapsing.

4. The apparatus according to claim 2, wherein said frame supply truck further comprises:
   a handle disposed on a rear surface of said rear framework so as to be pivotally withdrawable.

5. The apparatus according to claim 1 further comprising:
   truck guide means for vertically and horizontally positioning said frame supply truck and for introducing said frame supply truck into said frame supply section.

6. The apparatus according to claim 5, wherein said truck guide means comprises:
   a pair of front and rear guide rollers and a pair of front and rear grooved guide rollers disposed on bottom left and right ends of said frame supply truck;
   guide frameworks which said guide rollers and said grooved guide rollers run onto and travel on, disposed in said frame supply section; and
   an angled guide rail which said grooved guide rollers run onto and travel on, disposed on a side of said guide frameworks.

7. The apparatus according to claim 5, wherein said frame supply truck comprises:
   frame placing members for stacking and placing the group of ring frames thereon, disposed in a cantilever fashion;
   a pair of left and right side frameworks disposed so as to support, from the left and right side portions, the group of ring frames stacked and placed on said frame placing members;
   a rear framework disposed so as to support, from a rear side portion, the group of ring frames stacked and placed on said frame placing members; and
   a plurality of wheels enabling the integral movement of said frame placing members, said side frameworks and said rear framework.

8. The apparatus according to claim 7, wherein said frame supply truck further comprises:
   a frame guide member disposed on a front end of said side framework so as to be openable and closeable for preventing the group of ring frames stacked and placed on said frame placing members from forwardly collapsing.

9. The apparatus according to claim 7, wherein said frame supply truck further comprises:
   a handle disposed on a rear surface of said rear framework so as to be pivotally withdrawable.

10. The apparatus according to claim 5, wherein said frame supply truck comprises:
    a frame guide member for preventing the group of stacked ring frames from collapsing, disposed so as to be openable and closeable.

11. The apparatus according to claim 5, wherein said frame supply truck comprises:
    a handle disposed on a rear surface of said frame supply truck so as to be pivotally withdrawable.

12. The apparatus according to claim 1, wherein said lift unit comprises:
    a frame support arm for entering under the group of ring frames stacked and placed on said frame supply truck and for lifting the group of ring frames; and
    a raising/lowering mechanism for raising and lowering said frame support arm.

13. The apparatus according to claim 12, wherein said raising/lowering mechanism comprises:
    a movable framework for supporting said frame support arm in a cantilever fashion;
    a screw mechanism for raising and lowering said movable framework; and
    a motor for driving said screw mechanism.

14. The apparatus according to claim 1 further comprising:
    a tape peeling mechanism for peeling the residual tape from a lower surface of the ring frame after the adhesive tape is cut out by said tape cutting mechanism.

15. The apparatus according to claim 14, wherein said tape peeling mechanism comprises:

fixed rollers fixedly arranged in front of and behind the ring frame, for winding up and guiding the adhesive tape; and a pair of movable rollers for winding up and guiding the adhesive tape between said fixed rollers while moving.

16. The apparatus according to claim 1, wherein said frame supply truck comprises:

a frame guide member for preventing the group of stacked ring frames from collapsing, disposed so as to be openable and closeable.

17. The apparatus according to claim 1, wherein said frame supply truck comprises:

a handle disposed on a rear surface of said frame supply truck so as to be pivotally withdrawable.

* * * * *